United States Patent  (10) Patent No.: US 6,790,766 B2
Yamaoka et al.  (45) Date of Patent: Sep. 14, 2004

(54) METHOD OF FABRICATING SEMICONDUCTOR DEVICE HAVING LOW DIELECTRIC CONSTANT INSULATOR FILM

(75) Inventors: Yoshikazu Yamaoka, Ogaki (JP); Moritaka Nakamura, Yokohama (JP)

(73) Assignees: Sanyo Electric Co., Ltd., Osaka (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/391,022

(22) Filed: Mar. 19, 2003

(65) Prior Publication Data

US 2003/0181067 A1 Sep. 25, 2003

(30) Foreign Application Priority Data

Mar. 20, 2002 (JP) ........................................ 2002-077862

(51) Int. Cl.[7] ........................................ H01L 21/4763
(52) U.S. Cl. ........................ 438/623; 438/624; 438/634; 438/637; 438/638; 438/700; 438/707; 438/708; 438/710; 438/717; 438/725; 438/736; 438/737; 438/738
(58) Field of Search ................................. 438/622–624, 438/637–638, 700, 706–711, 714, 717, 719, 723–725, 736–738, 743–744, 780–782, 786, 794

(56) References Cited

U.S. PATENT DOCUMENTS

| | | | |
|---|---|---|---|
| 4,983,253 A | * | 1/1991 | Wolfe et al. ................. 156/643 |
| 5,254,213 A | * | 10/1993 | Tamaki ........................ 156/655 |
| 5,728,261 A | * | 3/1998 | Wolfe et al. ............. 156/662.1 |
| 6,080,529 A | * | 6/2000 | Ye et al. ....................... 430/318 |
| 6,127,273 A | * | 10/2000 | Laermer et al. ............ 438/709 |
| 6,143,667 A | * | 11/2000 | Marsh ......................... 438/740 |
| 6,194,128 B1 | * | 2/2001 | Tao et al. .................... 438/637 |

FOREIGN PATENT DOCUMENTS

JP  09-27399  1/1997

OTHER PUBLICATIONS

"Control of Ion Energy Distribution at Substrates During Plasma Etching", A.E. Wendt and S.B. Wang, Proceedings of 1st International Symposium on Dry Proess, Nov., 20 to 21, 2001 pp. 1–9.
"Study of Plasma–Surface Interactions on SiO$_2$ and Organic Low–k Dielectric By Using Plasma–Beam Irradiation", Kazuaki Kurihara, Y. Yamaoka, K. Karabashi, M. Sekine, and M. Nakamura, Proceedings of 1st International Symposium on Dry Proess, Nov., 20 to 21, 2001 pp: 141–146.
Bass et al., *Measurements of Charge Accumulation Induced by Monochromatic Low–Energy Electrons at the Surface of Insulating Samples*, J. Appl. Phys., vol. 84, No. 5, Sep. 1, 1998, American Institute of Physics, pp. 2740–2748.

* cited by examiner

*Primary Examiner*—Lynne Gurley
(74) *Attorney, Agent, or Firm*—McDermott Will & Emery LLP

(57) ABSTRACT

A method of fabricating a semiconductor device capable of increasing the selectivity of a low dielectric constant insulator film to an etching mask layer such as an etching stopper film without increasing the thickness of the etching mask layer is obtained. This method of fabricating a semiconductor device comprises steps of forming a first insulator film including a polymer film containing C and H, forming a first etching mask layer containing Si on a prescribed region of the first insulator film and plasma-etching the first insulator film with etching gas containing nitrogen and monochromated ion energy having a narrow energy width through a mask of the first etching mask layer.

20 Claims, 11 Drawing Sheets

METHOD OF FABRICATING SEMICONDUCTOR DEVICE HAVING LOW DIELECTRIC CONSTANT INSULATOR FILM

BACKGROUND OF THE INVENTION

1. Field of the Invention

The present invention relates to a method of fabricating a semiconductor device, and more specifically, it relates to a method of fabricating a semiconductor device including a low dielectric constant insulator film.

2. Description of the Background Art

The importance of a copper wiring technique has recently been increased following requirement for a high-speed semiconductor integrate circuit. In this regard, there is proposed a dual damascene structure obtained by combining a copper wire and a low dielectric constant interlayer dielectric film with each other. The dual damascene structure is generally constructed by forming a wiring trench and a contact hole (via hole) in an insulator film by etching, filling up the wiring trench and the contact hole with a metal and thereafter removing an excess depositional portion by polishing thereby forming a buried wire.

FIGS. 21 to 23 are sectional views for illustrating a conventional process of fabricating a semiconductor device including a dual damascene structure. The conventional process of fabricating a semiconductor device including a dual damascene structure is now described with reference to FIGS. 21 to 23.

First, a first low dielectric constant interlayer dielectric film 102 consisting of an organic polymer is formed on a metal cap barrier film 101, as shown in FIG. 21. An etching stopper film 103 consisting of $SiO_2$ or $Si_3N_4$ having an opening 103a is formed on a prescribed region of the first low dielectric constant interlayer dielectric film 102. A second low dielectric constant interlayer dielectric film 104 consisting of an organic polymer is formed to cover the etching stopper film 103. Thereafter a hard mask 105 consisting of an $SiO_2$ or $Si_3N_4$ film having an opening 105a is formed on the second low dielectric constant interlayer dielectric film 104.

As shown in FIG. 22, the hard mask 105 and the etching stopper film 103 are employed as masks for plasma-etching the second and first low dielectric constant interlayer dielectric films 104 and 102, thereby simultaneously forming a wiring trench 107 and a via hole (contact hole) 106.

As shown in FIG. 23, the via hole 106 and the wiring trench 107 are filled up with copper and an excess depositional portion is removed by polishing, thereby forming a buried wire 108 consisting of copper. Thus, the conventional semiconductor device including a dual damascene structure is formed.

In the aforementioned conventional method of fabricating a semiconductor device including a dual damascene structure, however, the etching stopper film 103 must be prepared from a material having a high etching selectivity with respect to the first and second low dielectric constant interlayer dielectric films 102 and 104 in the plasma etching step shown in FIG. 22. In general, therefore, the etching stopper film 103 is formed by an $SiO_2$ film (dielectric constant: 3.9 to 4.5) or an $Si_3N_4$ film (dielectric constant: 6 to 9) having a relatively high dielectric constant. In order to prevent the via hole 106 from deforming in this case, the thickness of the etching stopper film 103 consisting of $SiO_2$ or the like must be increased. In the final dual damascene structure shown in FIG. 23, therefore, the effective dielectric constant of the overall insulator film including the first low dielectric constant interlayer dielectric film 102, the etching stopper film 103 and the second low dielectric constant interlayer dielectric film 102 is disadvantageously increased.

SUMMARY OF THE INVENTION

An object of the present invention is to provide a method of fabricating a semiconductor device capable of increasing the etching selectivity of a low dielectric constant insulator film without increasing the thickness of the etching mask layer to an etching mask layer such as an etching stopper film.

Another object of the present invention is to suppress increase of the effective dielectric constant of the overall insulator film including the etching mask layer and the low dielectric constant insulator film in the aforementioned method of fabricating a semiconductor device.

In order to attain the aforementioned objects, a method of fabricating a semiconductor device according to a first aspect of the present invention comprises steps of forming a first insulator film including a polymer film containing C and H, forming a first etching mask layer containing Si on a prescribed region of the first insulator film, and plasma-etching the first insulator film through a mask of the first etching mask layer with plasmas of etching gases containing a nitrogen atom and monochromated ions energy having a narrow energy width.

When plasma-etching the first insulator film with the etching gas containing a nitrogen atom and the ions having a narrow energy width through the mask of the first etching mask layer containing an Si atom (silicon atom) thereby adjusting the range of the monochromatic ion energy in the method of fabricating a semiconductor device according to the first aspect, the etching selectivity of the first insulator film such as a low dielectric constant insulator film to the first etching mask layer can be easily increased. Thus, the thickness of the first etching mask layer consisting of a material having a relatively high dielectric constant may not be increased, whereby the overall insulator film including the first insulator film and the first etching mask layer can be inhibited from increase of the effective dielectric constant.

In the aforementioned method of fabricating a semiconductor device according to the first aspect, the plasma etching step preferably includes a step of plasma-etching the first insulator film with the etching gas including either ammonia gas or mixed gas of nitrogen gas and hydrogen gas and the monochromated ion energy of at least 200 eV and not more than 600 eV. According to this structure, the etching selectivity of the first insulator film such as a low dielectric constant insulator film to the first etching mask layer can be increased to at least about 5.

In this case, the plasma etching step preferably includes a step of plasma-etching the first insulator film with the etching gas including either ammonia gas or mixed gas of nitrogen gas and hydrogen gas and the monochromatic ion energy of at least 400 eV and not more than 600 eV. According to this structure, the etching selectivity of the first insulator film such as a low dielectric constant insulator film to the first etching mask layer can be increased to at least about 5 and the etching rate can be increased.

In the aforementioned method of fabricating a semiconductor device according to the first aspect, the plasma etching step preferably includes a step of plasma-etching the first insulator film with the etching gas including nitrogen gas and the monochromatic ion energy of at least 200 eV and not more than 400 eV. According to this structure, the etching selectivity of the first insulator film such as a low dielectric constant insulator film to the first etching mask layer can be increased to at least about 5.

In the aforementioned method of fabricating a semiconductor device according to the first aspect, the first etching mask layer is preferably a film containing an Si atom. When the first etching mask layer contains an Si atom, the etching selectivity of the first insulator film such as a low dielectric constant insulator film to the first etching mask layer can be increased by employing the aforementioned etching conditions. In this case, the first etching mask layer preferably includes at least one film selected from a group of an $Si_3N_4$ film, an $SiO_2$ film and an SiOCH film.

In the aforementioned method of fabricating a semiconductor device according to the first aspect, the first etching mask layer preferably includes an $Si_3N_4$ film, and the plasma etching step preferably includes a step of plasma-etching the first insulator film with the etching gas including ammonia gas and the monochromatic ion energy having a narrow energy width through a mask of the first etching mask layer including the $Si_3N_4$ film. According to this structure, the etching selectivity of the first insulator film such as a low dielectric constant insulator film to the first etching mask layer can be further increased.

In the aforementioned method of fabricating a semiconductor device according to the first aspect, the first insulator film is preferably a low dielectric constant insulator film having a dielectric constant of less than 3.9. When the low dielectric constant insulator film is employed as the first insulator film, inter-wire capacitance can be reduced.

In the aforementioned method of fabricating a semiconductor device according to the first aspect, the plasma etching step preferably includes a step of plasma-etching the first insulator film with the monochromatic ion energy, defined as e(Vp+Vbias) when employing a plasma etching apparatus applying a DC bias voltage Vbias to a plasma source, assuming that Vp represents a plasma potential. According to this structure, the etching selectivity of the first insulator film such as a low dielectric constant insulator film to the first etching mask layer can be easily increased by adjusting the range of the monochromatic ion energy e(Vp+Vbias) when employing the plasma etching apparatus applying the DC bias voltage Vbias to the plasma source.

In the aforementioned method of fabricating a semiconductor device according to the first aspect, the plasma etching step preferably includes a step of plasma-etching the first insulator film with the monochromatic ion energy prepared from high energy peak ion energy defined as e(Vp+2Vrf) when employing a plasma etching apparatus applying a high-frequency bias voltage Vrf·sin($2\pi$ft), to a substrate, assuming that Vp represents a plasma potential. According to this structure, the etching selectivity of the first insulator film such as a low dielectric constant insulator film to the first etching mask layer can be easily increased by adjusting the monochromatic ion energy e(Vp+2Vrf) when employing the plasma etching apparatus applying the high-frequency bias voltage Vrf·sin($2\pi$ft) to the substrate.

In the aforementioned method of fabricating a semiconductor device according to the first aspect, the plasma etching step preferably includes a step of plasma-etching the first insulator film with the monochromated ion energy e(Vp+|Vdc|) when employing a plasma etching apparatus applying a high-frequency bias voltage Vrf·sin($2 \cdot f_1 t$) having a high frequency $f_1$ of at least 10 MHz to a substrate, assuming that Vp represents a plasma potential and Vdc represents a voltage depending on electric charges stored in the substrate. According to this structure, the etching selectivity of the first insulator film such as a low dielectric constant insulator film to the first etching mask layer can be easily increased by adjusting the range of the monochromated ion energy e(Vp+|Vdc|) when employing the plasma etching apparatus applying the high-frequency bias voltage Vrf·sin($2\pi f_1 t$) having the high frequency $f_1$ of at least 10 MHz to the substrate.

In the aforementioned method of fabricating a semiconductor device according to the first aspect, the plasma etching step preferably includes a step of plasma-etching the first insulator film with the monochromatic ion energy e(Vp+|VPL|) when employing a plasma etching apparatus applying a pulse bias voltage VPL to the substrate, assuming that Vp represents a plasma potential. According to this structure, the etching selectivity of the first insulator film such as a low dielectric constant insulator film to the first etching mask layer can be easily increased by adjusting the monochromatic ion energy e(Vp+|VPL|) when employing the plasma etching apparatus applying the pulse bias voltage VPL to the substrate.

The aforementioned method of fabricating a semiconductor device according to the first aspect preferably further comprises steps of forming a second insulator film including a polymer film containing a carbon atom and a hydrogen atom on the first etching mask layer and forming a second etching mask layer on a prescribed region of the second insulator film in advance of the plasma etching step, while the plasma etching step preferably includes a step of plasma-etching the second insulator film and the first insulator film with the etching gas containing a nitrogen atom and the monochromatic ion energy having a narrow energy width through masks of the second etching mask layer and the first etching mask layer thereby simultaneously forming a via hole and a wiring trench. According to this structure, the etching selectivity of the first and second insulator films such as low dielectric constant insulator films to the first etching mask layer can be increased, whereby the thickness of the first etching mask layer consisting of a material having a relatively high dielectric constant may not be increased. Thus, the overall insulator film including the first insulator film, the first etching mask layer and the second insulator film can be inhibited from increase of the effective dielectric constant. Consequently, a dual damascene structure consisting of a low dielectric constant insulator film having a via hole (contact hole) and a wiring trench can be formed.

In this case, the second insulator film is preferably a low dielectric constant insulator film having a dielectric constant of less than 3.9. When the low dielectric constant insulator film is employed as the second insulator film, inter-wire capacitance can be reduced.

A method of fabricating a semiconductor device according to a second aspect of the present invention comprises steps of forming a first insulator film including a polymer film containing a carbon atom and a hydrogen atom, forming a first etching mask layer containing an Si atom on a prescribed region of the first insulator film, forming a second insulator film including a polymer film containing C and H on the first etching mask layer, forming a second etching mask layer on a prescribed region of the second insulator film and simultaneously forming a via hole and a wiring trench by plasma-etching the second insulator film and the first insulator film with etching gas containing nitrogen and monochromated ion energy having a narrow energy width through masks of the second etching mask layer and the first etching mask layer.

When plasma-etching the second insulator film and the first insulator film with the etching gas containing a nitrogen atom and the monochromated ion energy having a narrow energy width through the masks of the second etching mask layer and the first etching mask layer containing Si thereby adjusting the monochromated ion energy in the method of fabricating a semiconductor device according to the second aspect, the etching selectivity of the first and second insulator films such as low dielectric constant insulator films and the first etching mask layer can be easily increased. Thus, the thickness of the first etching mask layer consisting of a material having a relatively high dielectric constant may not be increased, whereby the overall insulator film including the first insulator film, the first etching mask layer and the second insulator film can be inhibited from increase of the effective dielectric constant. Consequently, a dual damascene structure consisting of a low dielectric constant insulator film having a via hole (contact hole) and a wiring trench can be formed.

In the aforementioned method of fabricating a semiconductor device according to the second aspect, the step of simultaneously forming the via hole and the wiring trench preferably includes a step of plasma-etching the second insulator film and the first insulator film with the etching gas including either ammonia gas or mixed gas of nitrogen gas and hydrogen gas and the monochromatic ion energy of at least 200 eV and not more than 600 eV. According to this structure, the etching selectivity of the first and second insulator films consisting of low dielectric constant insulator films or the like to the first etching mask layer can be increased to at least about 5.

In this case, the step of simultaneously forming the via hole and the wiring trench preferably includes a step of plasma-etching the second insulator film and the first insulator film with the etching gas including either ammonia gas or mixed gas of nitrogen gas and hydrogen gas and the monochromatic ion energy of at least 400 eV and not more than 600 eV. According to this structure, the selectivity of the first and second insulator films consisting of low dielectric constant insulator films or the like to the first etching mask layer can be increased to at least about 5, while the etching rate can be increased.

In the aforementioned method of fabricating a semiconductor device according to the second aspect, the step of simultaneously forming the via hole and the wiring trench preferably includes a step of plasma-etching the second insulator film and the first insulator film with the etching gas including nitrogen gas and the monochromatic ion energy of at least 200 eV and not more than 400 eV. According to this structure, the selectivity of the first and second insulator films consisting of low dielectric constant insulator films or the like to the first etching mask layer can be increased to at least about 5.

In the aforementioned method of fabricating a semiconductor device according to the second aspect, the first etching mask layer is preferably a film containing Si. When the first etching mask layer is formed by such a film, the etching selectivity of the first and second insulator films such as low dielectric constant insulator films to the first etching mask layer can be increased by employing the aforementioned etching conditions.

In the aforementioned method of fabricating a semiconductor device according to the second aspect, the first etching mask layer preferably includes an $Si_3N_4$ film, and the step of simultaneously forming the via hole and the wiring trench preferably includes a step of plasma-etching the second insulator film and the first insulator film with the etching gas including ammonia gas and the monochromatic ion energy having a narrow energy width through masks of the second etching mask layer and the first etching mask layer including the $Si_3N_4$ film. According to this structure, the etching selectivity of the first and second insulator films such as low dielectric constant insulator films to the first etching mask layer can be further increased.

In the aforementioned method of fabricating a semiconductor device according to the second aspect, the first insulator film and the second insulator film are preferably low dielectric constant insulator films having dielectric constants of less than 3.9. When the low dielectric constant insulator films are employed as the first and second insulator films, inter-wire capacitance can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A process of fabricating a semiconductor device including a dual damascene structure according to a first embodiment of the present invention is described with reference to FIGS. 1 to 6.

Figure 1:
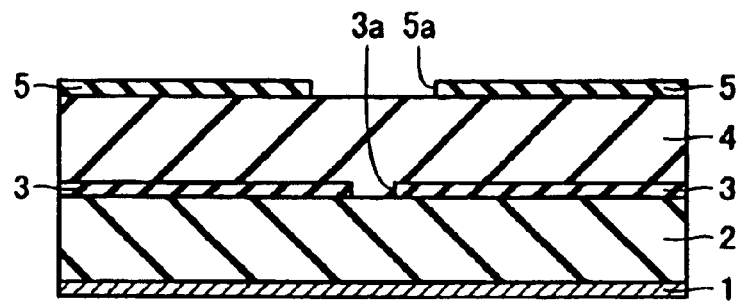
FIGS. 1 to 3 are sectional views for illustrating a fabrication process for a semiconductor device according to a first embodiment of the present invention.

First, a first low dielectric constant interlayer dielectric film 2 of GX-3 (registered trademark), which is an organic polymer by Honeywell Electric Materials, for example, is formed on a metal cap barrier film 1 with a thickness of about 700 nm, as shown in FIG. 1. An etching stopper film 3 consisting of $Si_3N_4$, $SiO_2$ or SiOCH having an opening 3a is formed on the first low dielectric constant interlayer dielectric film 2 with a thickness of about 70 nm to about 200 nm. Thereafter a second low dielectric constant interlayer dielectric film 4 of GX-3 is formed on the etching stopper film 3 with a thickness of about 400 nm. The first and second low dielectric constant interlayer dielectric films 2 and 4 have dielectric constants (less than 3.9) lower than that of $Si_3N_4$, $SiO_2$ or SiOCH.

A hard mask 5 consisting of an $Si_3N_4$, $SiO_2$ or SiOCH film having an opening 5a is formed on the second low dielectric constant interlayer dielectric film 4 with a thickness of about 70 nm to about 200 nm. The SiOCH film includes the so-called SiC film. The SiOCH film is typically prepared by mixing a methyl group into $SiO_2$.

The etching stopper film 3 is an example of the "first etching mask layer" in the present invention, and the hard mask 5 is an example of the "second etching mask layer" in the present invention. The first and second low dielectric constant interlayer dielectric films 2 and 4 are examples of the "first insulator film" and the "second insulator film" in the present invention respectively.

Figure 2:
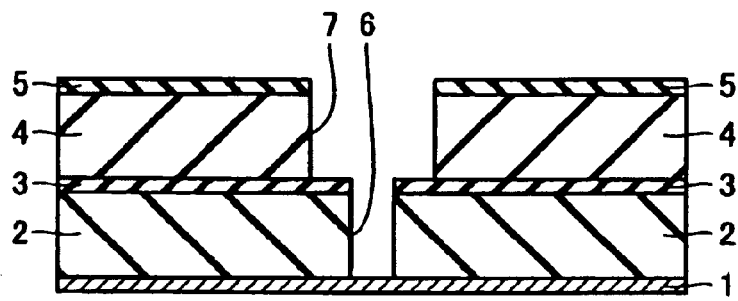

As shown in FIG. 2, the hard mask 5 and the etching stopper film 3 are employed as masks for plasma-etching the second and first low dielectric constant interlayer dielectric films 4 and 2, thereby forming a wiring trench 7 and a via hole (contact hole) 6.

Figure 4:
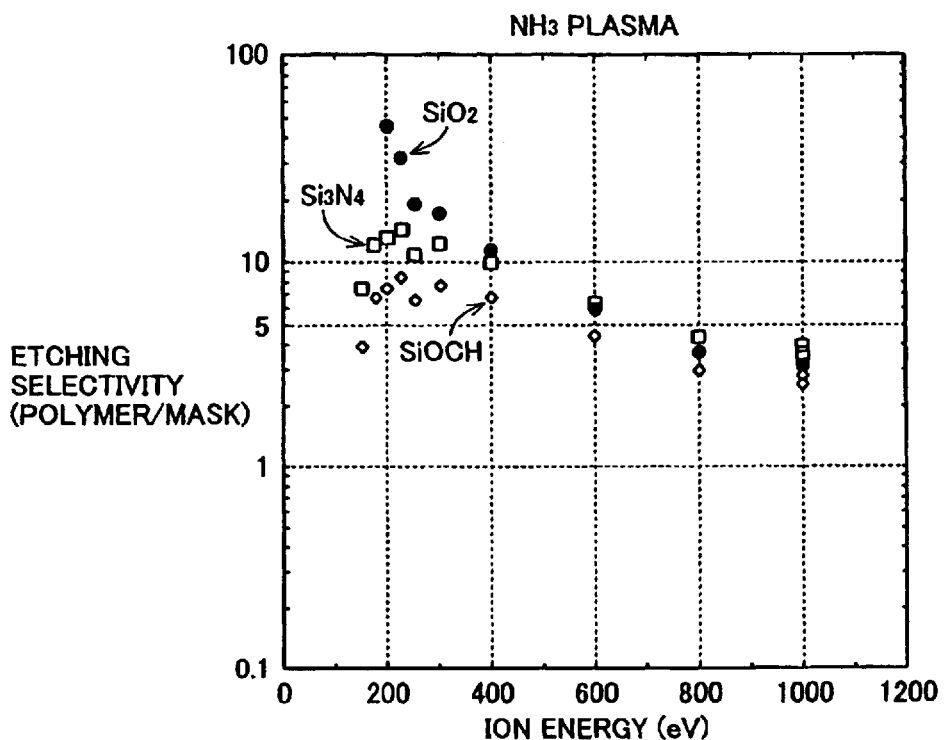
FIG. 4 is a characteristic diagram showing the relation between ion energy and etching selectivity with respect to an $Si_3N_4$ film, an $SiO_2$ film and an SiOCH film in a case of employing ammonia ($NH_3$) gas.

In the etching process according to the first embodiment, ammonia ($NH_3$) gas is employed as etching gas while plasma etching is performed with monochromated ion energy of at least about 200 eV and not more than about 600 eV having a narrowed energy width. When employing ammonia ($NH_3$) gas, the ion energy is set to at least about 200 eV and not more than about 600 eV gas for the following reason:

When employing ammonia ($NH_3$) gas as the etching gas, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5 by setting the ion energy to not more than about 600 eV, as clearly understood from a characteristic diagram shown in FIG. 4. When employing ammonia ($NH_3$) gas as the etching gas, further, ion energy of at least about 200 eV is necessary for obtaining a certain degree of etching yield (etching rate) with respect to the first and second low dielectric constant interlayer dielectric films 2 and 4 consisting of GX-3, as understood from a characteristic diagram shown in FIG. 6. Thus, the ion energy is set to at least about 200 eV and not more than about 600 eV in the first embodiment when employing ammonia ($NH_3$) gas.

A high etching selectivity of at least about 5 can be obtained by performing plasma etching under the aforementioned conditions, whereby the thickness of the etching stopper film 3 can be reduced. Thus, the overall insulator film including the first low dielectric constant interlayer dielectric film 2, the etching stopper film 3 and the second low dielectric constant interlayer dielectric film 4 can be inhibited from increase of the effective dielectric constant resulting from increase of the thickness of the etching stopper film 3.

Figure 5:
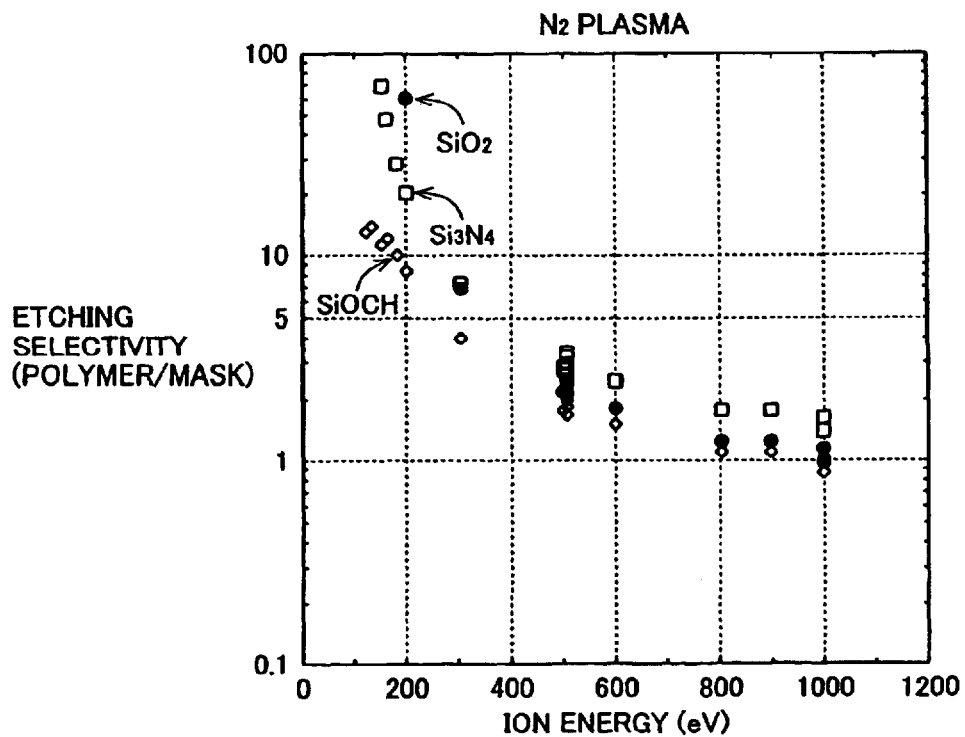
FIG. 5 is a characteristic diagram showing the relation between ion energy and etching selectivity with respect to an $Si_3N_4$ film, an $SiO_2$ film and an SiOCH film in a case of employing nitrogen ($N_2$) gas.

The etching gas may alternatively be prepared from nitrogen ($N_2$) gas. In this case, plasma etching is performed with monochromated ion energy of at least about 200 eV and not more than about 400 eV. When employing nitrogen ($N_2$) gas, the ion energy is set to at least about 200 eV and not more than about 400 eV for the following reason:

When employing nitrogen ($N_2$) gas as the etching gas, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5 by setting the ion energy to not more than about 400 eV, as clearly understood from a characteristic diagram shown in FIG. 5. When employing nitrogen ($N_2$) gas as the etching gas, further, ion energy of at least about 200 eV is necessary for obtaining a certain degree of etching yield (etching rate) with respect to the first and second low dielectric constant interlayer dielectric films 2 and 4 consisting of GX-3, as understood from the characteristic diagram shown in FIG. 6. Thus, the ion energy is preferably set to at least about 200 eV and not more than about 400 eV when employing nitrogen ($N_2$) gas.

Figure 6:
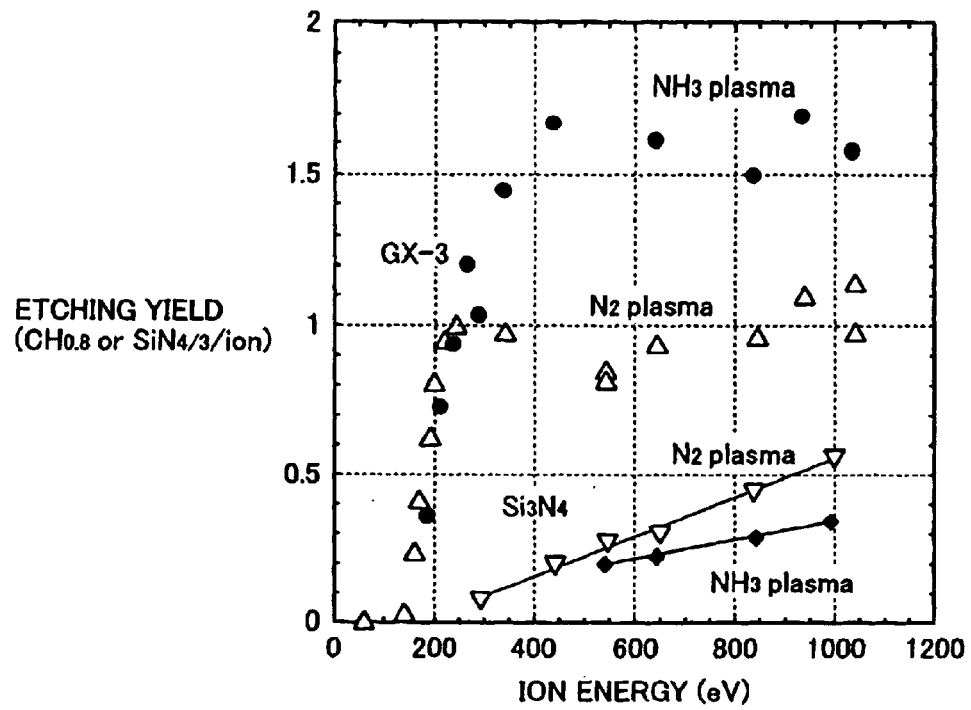
FIG. 6 is a characteristic diagram showing the relation between ion energy and etching yields of an organic polymer film (GX-3 film) and an $Si_3N_4$ film in a case of employing ammonia ($NH_3$) gas or nitrogen ($N_2$) gas.

In the aforementioned etching process, a nitrogen atom N-containing ions ($NH_x^+{}_{(x=1-4)}$, $N_2^+$) contained in ammonia ($NH_3$) gas or nitrogen ($N_2$) gas chemically react with carbon contained in the polymer films (GX-3 films) forming the first and second low dielectric constant interlayer dielectric films 2 and 4 thereby prompting etching. In this etching, the etching yield (etching rate) is accelerated from about 100 eV and abruptly increased following increase of the ion energy, as shown in FIG. 6. When ammonia ($NH_3$) gas is employed, the etching yield (etching rate) is saturated at about 400 eV.

When nitrogen ($N_2$) gas is employed, the etching yield (etching rate) is saturated at about 200 eV.

In the etching stopper film 3 consisting of $Si_3N_4$, on the other hand, the etching yield (etching rate) is monotonically increased with respect to ammonia ($NH_3$) gas or nitrogen ($N_2$) gas following increase of the ion energy, as shown in FIG. 6. Thus, it is understood that the selectivity of the first and second low dielectric constant interlayer dielectric films 2 and 4 to the etching stopper film 3 is increased with the decrease of the ion energy. Therefore, the ion energy is preferably minimized in order to simply increase the selectivity. In order to increase the etching yield (etching rate), however, ion energy of at least about 400 eV saturating the etching yield is preferable when employing ammonia ($NH_3$) gas, while ion energy of at least about 200 eV saturating the etching yield is preferable when employing nitrogen ($N_2$) gas, as hereinabove described.

As understood from the characteristic diagrams shown in FIGS. 4 and 6, therefore, the ion energy is preferably set to at least about 400 eV and not more than about 600 eV in order to increase the selectivity to at least about 5 while increasing the etching yield (etching rate) when ammonia ($NH_3$) gas is employed. As understood from the characteristic diagrams shown in FIGS. 5 and 6, on the other hand, the ion energy is preferably set to at least about 200 eV and not more than about 400 eV in order to increase the selectivity to at least about 5 while increasing the etching yield (etching rate) when nitrogen ($N_2$) gas is employed.

Figure 7:
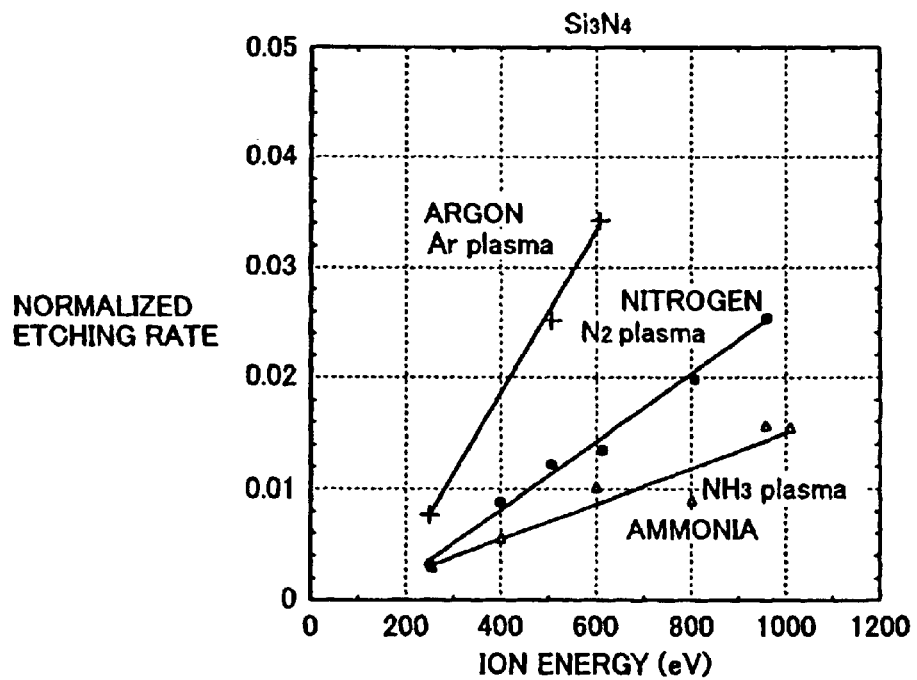
FIG. 7 is a characteristic diagram showing the relation between ion energy and normalized etching rates in a case of etching an $Si_3N_4$ film with argon gas, nitrogen gas and ammonia gas employed as etching gas.
Figure 8:
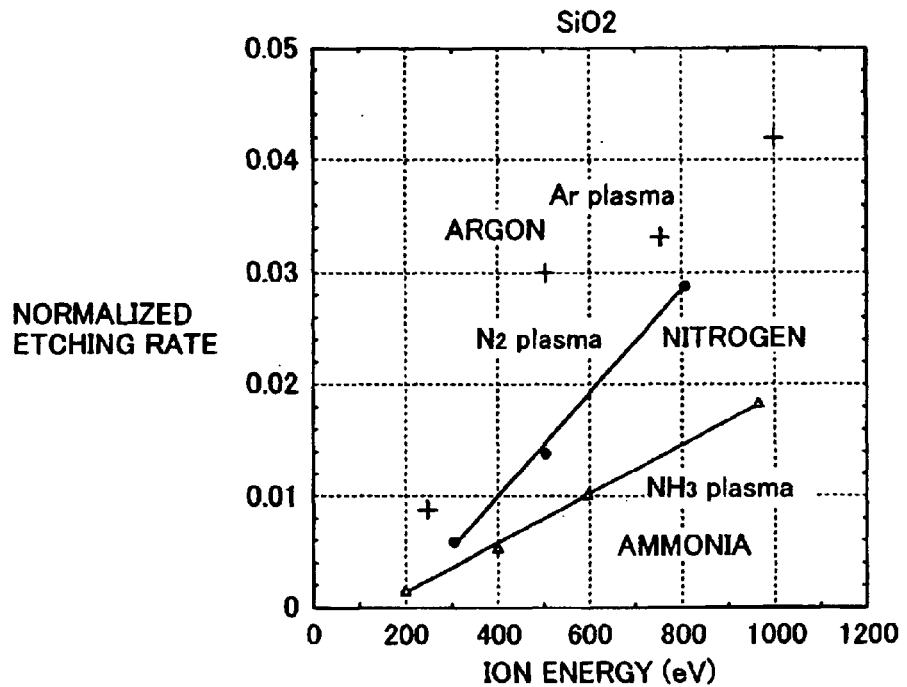
FIG. 8 is a characteristic diagram showing the relation between ion energy and normalized etching rates in a case of etching an $SiO_2$ film with argon gas, nitrogen gas and ammonia gas employed as etching gas.
Figure 9:
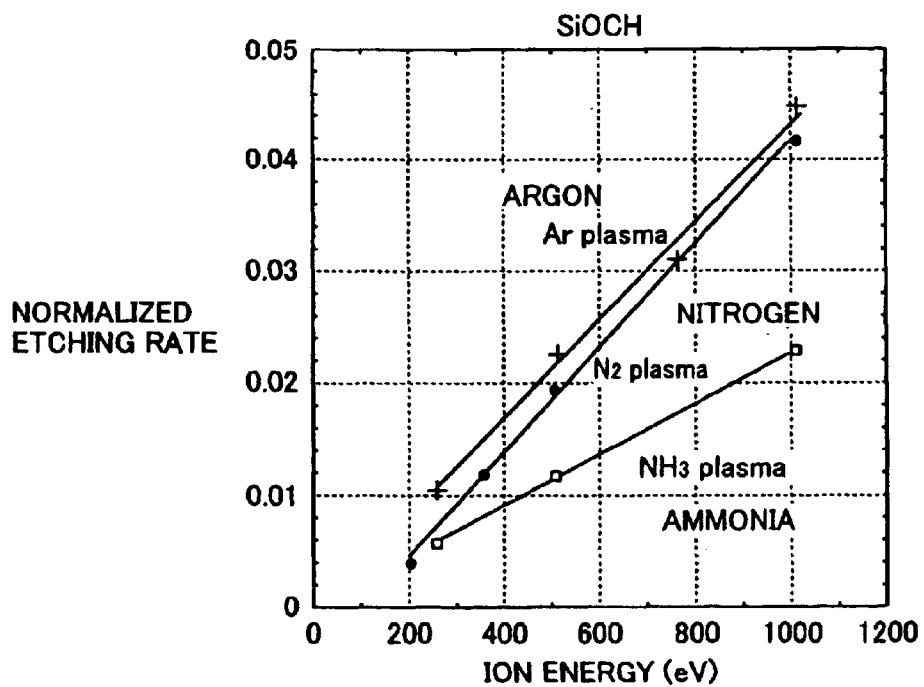
FIG. 9 is a characteristic diagram showing the relation between ion energy and normalized etching rates in a case of etching an SiOCH film with argon gas, nitrogen gas and ammonia gas employed as etching gas.

FIGS. 7 to 9 show the relation between ion energy values and normalized etching rates in cases of etching $Si_3N_4$, $SiO_2$ and SiOCH films with etching gas of argon (Ar) gas, nitrogen ($N_2$) gas and ammonia ($NH_3$) gas respectively. In these figures, film with higher slope of data is easier to be etched. Comparing FIGS. 7 to 9 with each other from this viewpoint, it is understood that the $Si_3N_4$ film is hardest to etch in either case of ammonia ($NH_3$) gas and nitrogen ($N_2$) gas. It is also understood that the etching rate of $Si_3N_4$ film is the slowest when ammonia ($NH_3$) gas is employed from among argon (Ar) gas, nitrogen ($N_2$) gas and ammonia ($NH_3$) gas. Thus, it is understood that the etching rate of etching stopper film is minimized and the etching selectivity is maximized using the etching stopper film 3 of $Si_3N_4$ and the etching gas of ammonia ($NH_3$) gas.

The structure of a plasma etching apparatus employed in the first embodiment for producing the monochromatic ion energy in the etching step shown in FIG. 2 is now described with reference to FIGS. 10 and 11.

Figure 10:
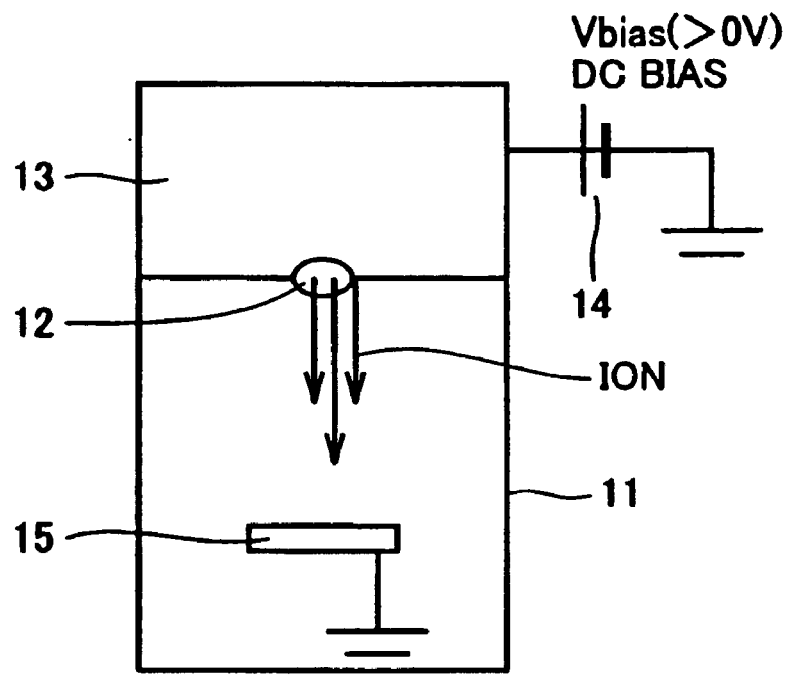
FIG. 10 schematically illustrates a plasma etching apparatus employed for the method of fabricating a semiconductor device according to the first embodiment of the present invention.
Figure 11:
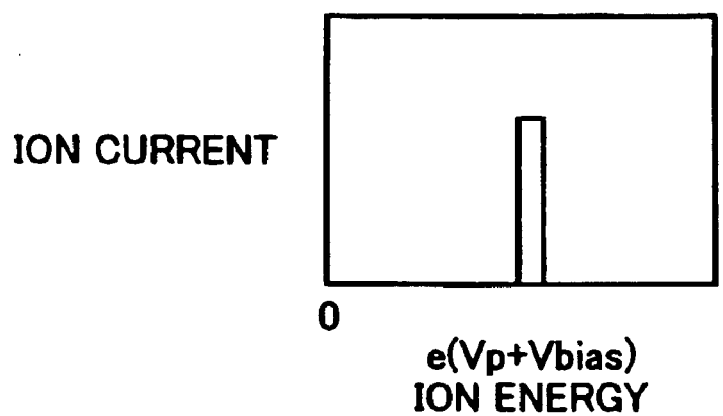
FIG. 11 is a characteristic diagram showing an ion energy distribution in the case of employing the plasma etching apparatus according to the first embodiment shown in FIG. 10.

As shown in FIG. 10, the plasma etching apparatus employed in the first embodiment comprises a high-vacuum sample chamber 11 and a plasma source 13, which are coupled together through an orifice 12. A DC bias supply 14 is connected to the plasma source 13. A substrate 15 is set in the sample chamber 11.

Plasma has an electrically neutral internal state, and hence a plasma potential Vp exhibits a positive value (several 10 V in general) with respect to the sample chamber 11. To be accurate, ion energy is equal to addition of the plasma potential Vp and the bias voltage Vbias for accelerating the ions.

In this case, the energy of the ions depends on a bias applied to the plasma source 13. When the DC bias voltage Vbias is applied to the plasma source 13, therefore, the center of the ion energy is defined as e(Vp+Vbias), and the ion energy distribution exhibits monochromatic, as shown in FIG. 11.

When ammonia ($NH_3$) gas is employed, the ion energy e(Vp+Vbias) is set in the range of at least about 200 eV and not more than about 600 eV. Thus, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5, as understood from the characteristic diagram show in FIG. 4. When nitrogen ($N_2$) gas is employed, the ion energy e(Vp+Vbias) is set in the range of at least about 200 eV and not more than about 400 eV. Thus, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5, as understood from the characteristic diagram show in FIG. 5.

If a high etching yield (etching rate) must be obtained in addition to the high selectivity, the ion energy e(Vp+Vbias) is preferably set to at least about 400 eV and not more than about 600 eV when ammonia ($NH_3$) gas is employed, or preferably set to at least about 200 eV and not more than about 400 eV when nitrogen ($N_2$) gas is employed.

Figure 3:
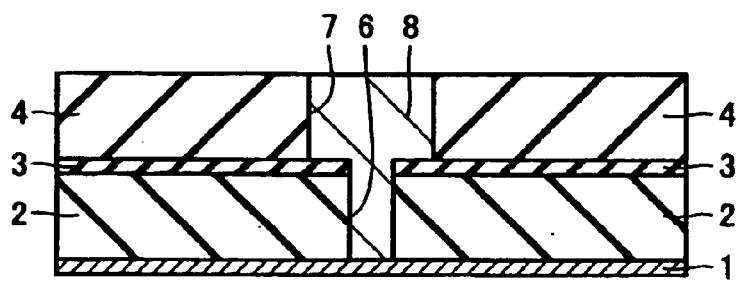

After the via hole 6 and the wiring trench 7 are formed as shown in FIG. 2 with the aforementioned plasma etching conditions and the aforementioned plasma etching apparatus, a dual damascene structure is formed through a step shown in FIG. 3. Referring to FIG. 3, the via hole 6 and the wiring trench 7 are filled up with copper and an excess depositional portion is removed by polishing, thereby forming a buried wire 8 consisting of copper. Thus, the semiconductor device including a dual damascene structure according to the first embodiment is completed.

(Second Embodiment)

According to a second embodiment of the present invention, monochromatic ion energy is formed through a plasma etching apparatus different from that employed in the first embodiment shown in FIG. 10.

Figure 12:
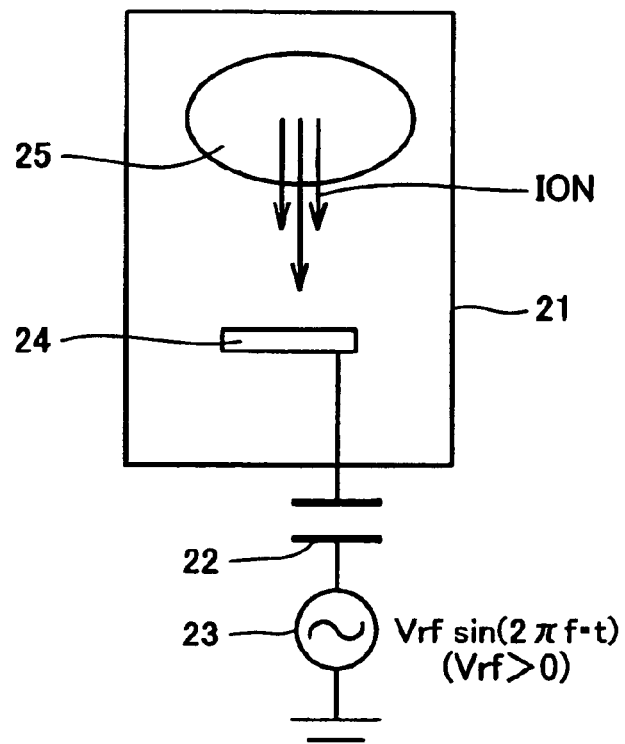
FIG. 12 schematically illustrates the structure of a plasma etching apparatus employed for a method of fabricating a semiconductor device according to a second embodiment of the present invention.

Referring to FIG. 12, the plasma etching apparatus employed in the second embodiment comprises a high-vacuum chamber 21, a capacitor 22 connected to a substrate 24 set in the high-vacuum chamber 21 and a high-frequency power source 23 connected to the capacitor 22. The plasma etching apparatus employed in the second embodiment applies a high-frequency bias voltage Vrf·sin(2πft) to the substrate 24.

Figure 13:
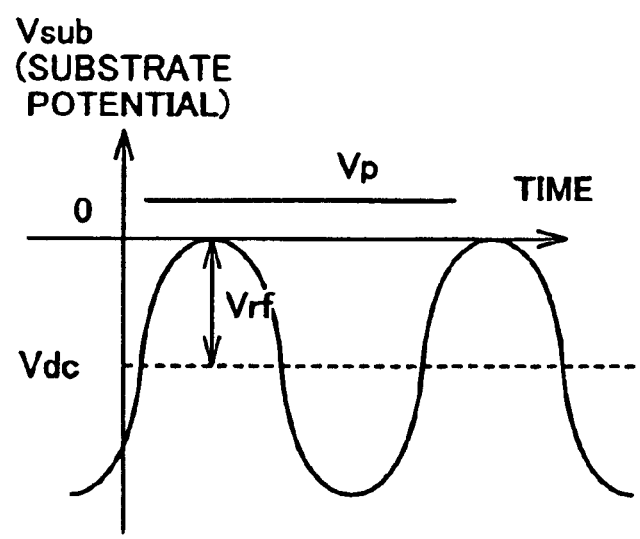
FIG. 13 illustrates a substrate potential with respect to a chamber according to the second embodiment of the present invention.
Figure 14:
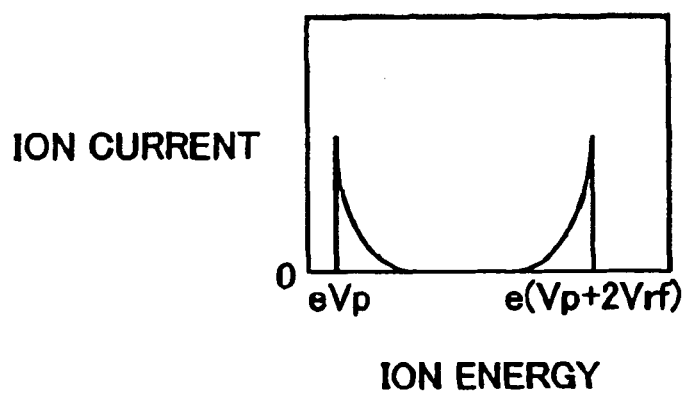
FIG. 14 is a characteristic diagram showing an ion energy distribution in the case of employing the plasma etching apparatus according to the second embodiment shown in FIG. 12.

Referring to FIGS. 12 to 14, the ion energy is minimized to eVp when ions are incident upon a field region (sheath) between a plasma region 25 and the substrate 24 on a crest of the bias voltage Vrf·sin(2πft) while the ion energy is maximized to e(Vp+2Vrf) when the ions are incident upon the sheath on a valley of the bias voltage Vrf·sin(2πft) if the frequency f of the bias voltage Vrf·sin(2πft) is lower than 1 MHz so that a transit time of the ion to pass through the sheath is shorter than 1/f. In other words, the width of the ion energy is 2 eVrf while two energy peaks are present in the vicinity of both ends thereof, as shown in FIG. 14. In this case, lower energy peak ions much less contribute to etching compared to higher energy peak ions. According to the second embodiment, therefore, the ion energy e(Vp+2Vrf) having the higher energy peak ions are employed as monochromated ion energy.

More specifically, the higher ion energy e(Vp+2Vrf) is set to at least about 200 eV and not more than about 600 eV when ammonia ($NH_3$) gas is employed as etching gas. Thus, the selectivity of first and second low dielectric constant interlayer dielectric films 2 and 4 consisting of GX-3 to an etching stopper film 3 consisting of $Si_3N_4$, $SiO_2$ or SiOCH can be increased to at least about 5, as understood from the characteristic diagram shown in FIG. 4. On the other hand, the higher ion energy e(Vp+2Vrf) is set to at least about 200 eV and not more than about 400 eV when nitrogen ($N_2$) gas is employed as the etching gas. Thus, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5, as understood from the characteristic diagram shown in FIG. 5.

If a high etching yield (etching rate) must be obtained in addition to the high selectivity, the ion energy (Vp+2Vrf) of the higher energy peak is preferably set to at least about 400 eV and not more than about 600 eV when ammonia ($NH_3$) gas is employed, or preferably set to at least about 200 eV and not more than about 400 eV when nitrogen ($N_2$) gas is employed.

(Third Embodiment)

Figure 15:
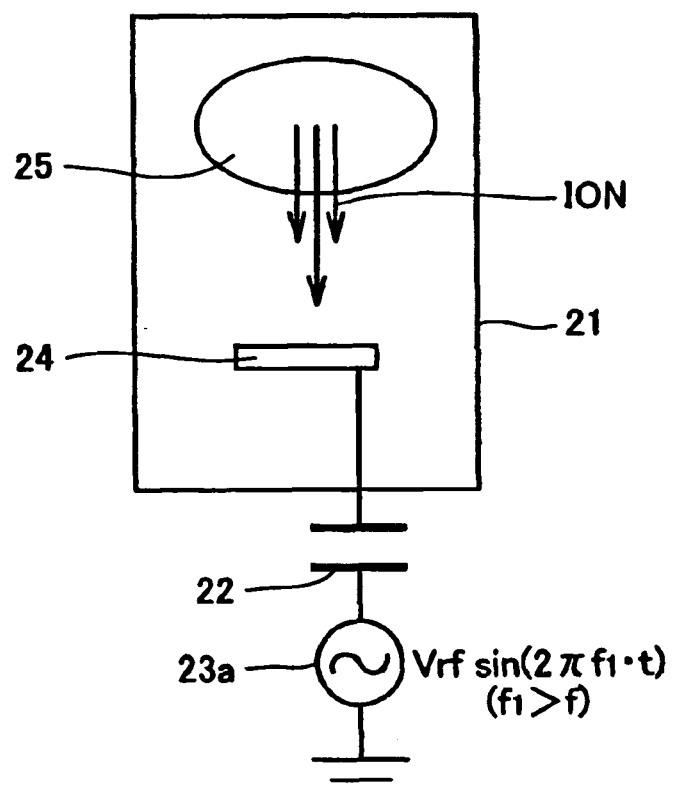
FIG. 15 schematically illustrates the structure of a plasma etching apparatus employed for a method of fabricating a semiconductor device according to a third embodiment of the present invention.
Figure 16:
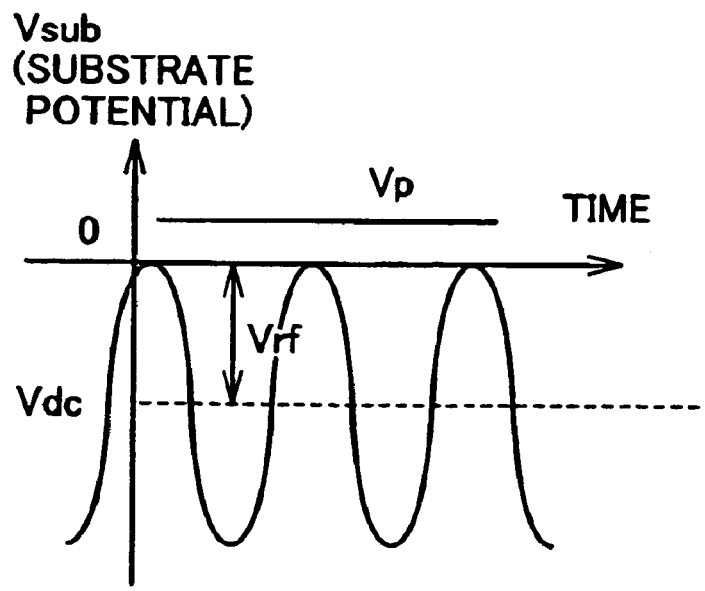
FIG. 16 illustrates a substrate potential with respect to a chamber according to the third embodiment of the present invention.
Figure 17:
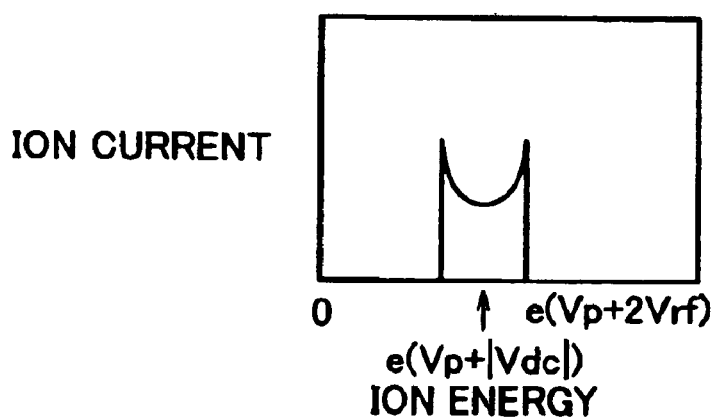
FIG. 17 is a characteristic diagram showing an ion energy distribution in the case of employing the plasma etching apparatus according to the third embodiment shown in FIG. 15.

Referring to FIGS. 15 to 17, a plasma etching apparatus similar to that employed in the second embodiment shown in FIG. 12 is employed according to a third embodiment of the present invention. In the plasma etching apparatus employed in the third embodiment, however, the bias frequency of a high-frequency power source 23a is increased.

The plasma etching apparatus employed in the third embodiment applies a high-frequency bias to a substrate 24, similarly to that employed in the aforementioned second embodiment. In this case, the high-frequency power source 23a applies a high-frequency voltage Vrf·sin($2\pi f_1 t$) having a high bias frequency $f_1$ of at least 10 MHz to the substrate 24 through a capacitor 22, in order to control the energy of ions. When applying higher bias frequency $f_1$, ions passing through a field region (sheath) between a plasma region 25 and the substrate 24 receive accelerating force and decelerating force. In this case, the ions are accelerated not by the high frequency $f_1$ but by a voltage Vdc depending on electric charges stored in the substrate 24. The voltage Vdc exhibits a negative value with respect to a chamber, to attract the ions.

In this case, the ion energy is expressed as e(Vp+|Vdc|). This ion energy e(Vp+|Vdc|) is set to at least about 200 eV and not more than 600 eV when ammonia ($NH_3$) gas is employed. Thus, the selectivity of first and second low dielectric constant interlayer dielectric films 2 and 4 consisting of GX-3 to an etching stopper film 3 consisting of $Si_3N_4$, $SiO_2$ or SiOCH can be increased to at least about 5, as understood from the characteristic diagram shown in FIG. 4. On the other hand, the ion energy e(Vp+|Vdc|) is set to at least about 200 eV and not more than about 400 eV when nitrogen ($N_2$) gas is employed as etching gas. Thus, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5, as understood from the characteristic diagram shown in FIG. 5.

If a high etching yield (etching rate) must be obtained in addition to the high etching selectivity, the ion energy e(Vp+|Vdc|) is preferably set to at least about 400 eV and not more than about 600 eV when ammonia ($NH_3$) gas is employed, or preferably set to at least about 200 eV and not more than about 400 eV when nitrogen ($N_2$) gas is employed.

(Fourth Embodiment)

Figure 18:
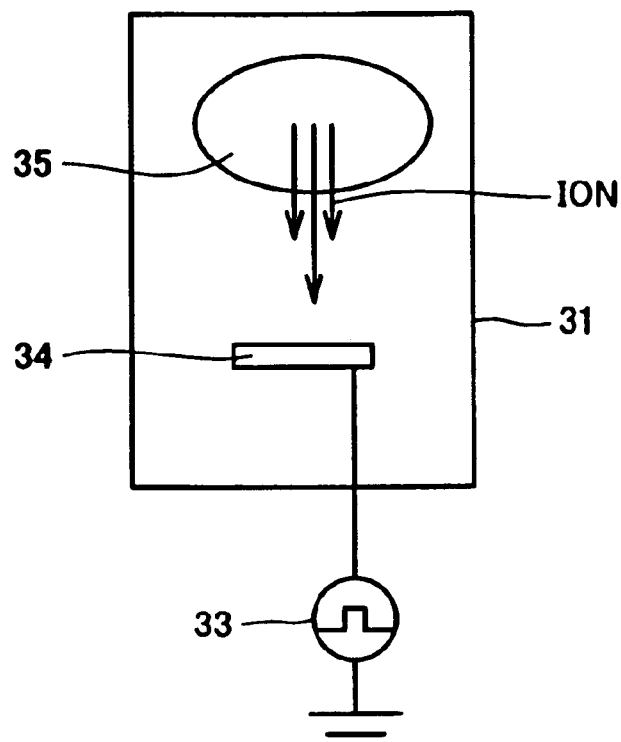
FIG. 18 schematically illustrates the structure of a plasma etching apparatus employed for a method of fabricating a semiconductor device according to a fourth embodiment of the present invention.

Referring to FIG. 18, a plasma etching apparatus employed in a fourth embodiment of the present invention comprises a high-vacuum chamber 31 and a pulse power source 33 connected to a substrate 34. The plasma etching apparatus employed in the fourth embodiment shown in FIG. 18 applies a pulse bias (pulse voltage) VPL to the substrate 34. Japanese Patent Laying-Open No. 9-27399 (1997) or the like discloses a plasma etching apparatus applying a pulse bias.

Figure 19:
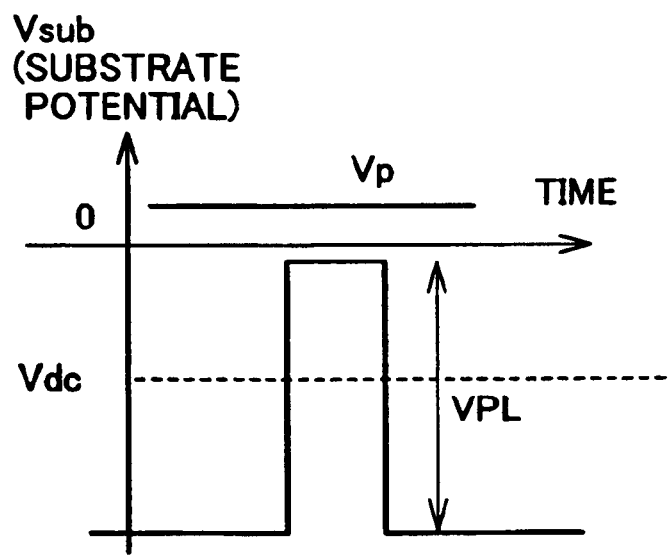
FIG. 19 illustrates a substrate potential with respect to a chamber according to the fourth embodiment of the present invention.
Figure 20:
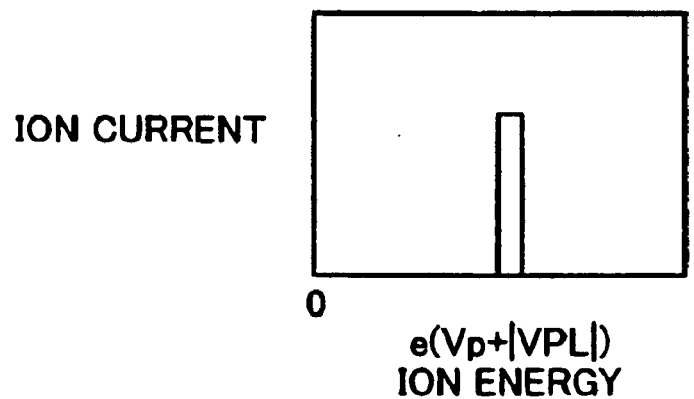
FIG. 20 is a characteristic diagram showing an ion energy distribution in the case of employing the plasma etching apparatus according to the fourth embodiment shown in FIG. 18.
Figure 21:
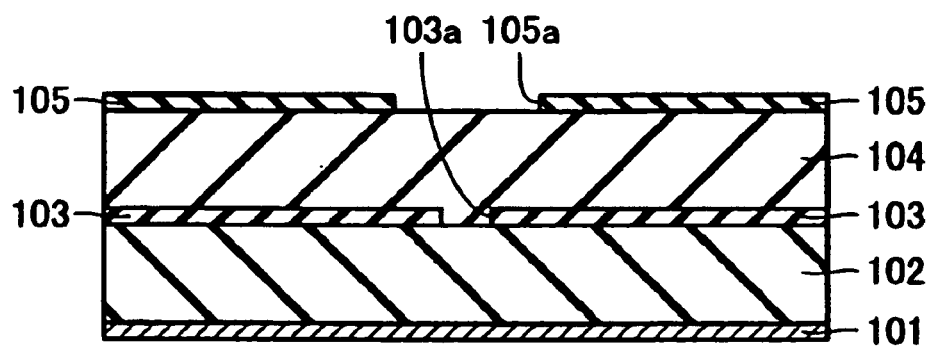
FIGS. 21 to 23 are sectional views for illustrating a conventional process of fabricating a semiconductor device including a dual damascene structure.
Figure 22:
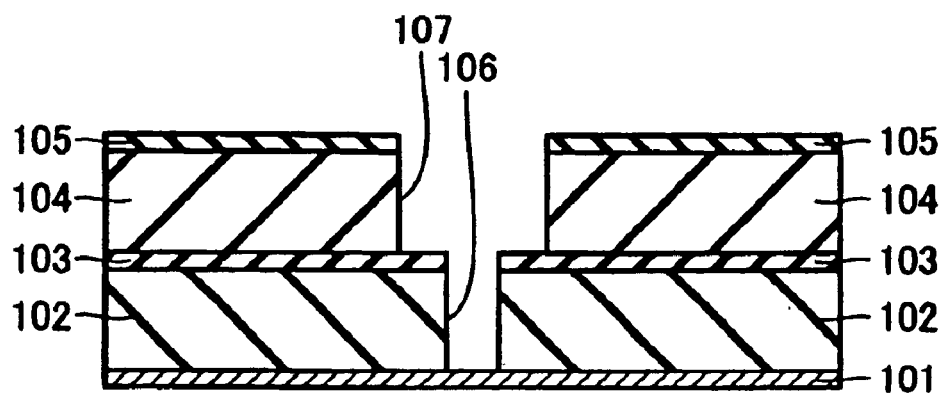
Figure 23:
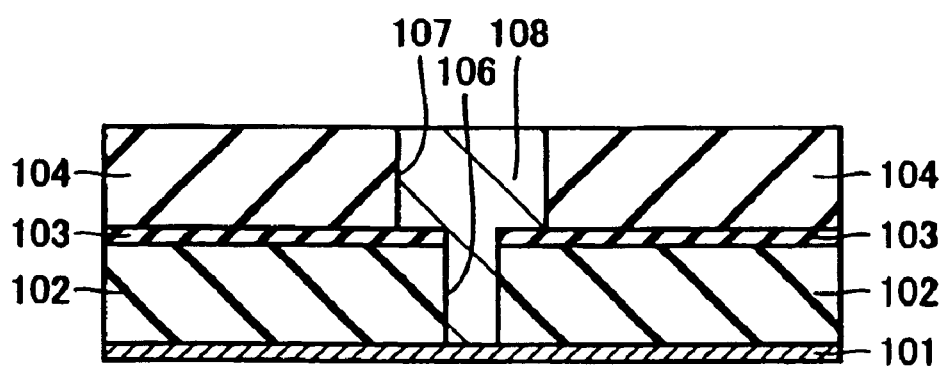

According to the fourth embodiment, a pulse shown in FIG. 19 is introduced as the bias for obtaining ion energy e(Vp+|VPL|), as shown in FIG. 20. This ion energy e(Vp+|VPL|) is set in the range of at least about 200 eV and not more than about 600 eV when ammonia ($NH_3$) gas is employed. Thus, the selectivity of first and second low dielectric constant interlayer dielectric films 2 and 4 consisting of GX-3 to an etching stopper film 3 consisting of $Si_3N_4$, $SiO_2$ or SiOCH can be increased to at least about 5, as understood from the characteristic diagram shown in FIG. 4. On the other hand, the ion energy e(Vp+|VPL|) is set to at least about 200 eV and not more than about 400 eV when nitrogen ($N_2$) gas is employed as etching gas. Thus, the selectivity of the first and second low dielectric constant interlayer dielectric films 2 and 4 consisting of GX-3 to the etching stopper film 3 consisting of $Si_3N_4$, $SiO_2$ or SiOCH can be increased to at least about 5, as understood from the characteristic diagram shown in FIG. 5.

If a high etching yield (etching rate) must be obtained in addition to the high selectivity, the ion energy e(Vp+|VPL|) is preferably set to at least about 400 eV and not more than about 600 eV when ammonia ($NH_3$) gas is employed, or preferably set to at least about 200 eV and not more than about 400 eV when nitrogen ($N_2$) gas is employed.

Although the present invention has been described and illustrated in detail, it is clearly understood that the same is by way of illustration and example only and is not to be taken by way of limitation, the spirit and scope of the present invention being limited only by the terms of the appended claims.

For example, while the etching stopper film 3 is prepared from $Si_3N_4$, $SiO_2$ or SiOCH in each of the aforementioned embodiments, the present invention is not restricted to this but a similar effect can be attained also when the etching stopper film 3 consists of another material, so far as the same contains Si.

While the organic polymers forming the first and second low dielectric constant interlayer dielectric films 2 and 4 are prepared from GX-3 (registered trademark) by Honeywell Electric Materials in each of the aforementioned embodiments, the present invention is not restricted to this but the first and second low dielectric constant interlayer dielectric films 2 and 4 can attain a similar effect also when the same are made of another polymer, so far as the polymer contains a carbon atom and a hydrogen atom.

While ammonia ($NH_3$) gas or nitrogen ($N_2$) gas is employed as the etching gas containing a nitrogen atom in each of the aforementioned embodiments, the present invention is not restricted to this but another gas containing a nitrogen atom may alternatively be employed. For example, mixed gas of $N_2$ and $H_2$ (with the mixing ratio of hydrogen gas in the range of 20% to 90%) may be employed. When employing the mixed gas of nitrogen gas and hydrogen gas, etching conditions such as ion energy similar to that for ammonia ($NH_3$) gas may be employed.

While each of the above embodiments has been described with reference to an etching process for forming a dual damascene structure, the present invention is not restricted to this but is also applicable to an etching process for another structure including an etching stopper film (etching mask layer) consisting of a film containing Si and a low dielectric constant insulator film consisting of an organic polymer film.

What is claimed is:

1. A method of fabricating a semiconductor device comprising steps of:

forming a first insulator film including a polymer film containing C and H;

forming a first etching mask layer containing Si on a prescribed region of said first insulator film; and plasma-etching said first insulator film through a mask of said first etching mask layer with plasmas of etching gas containing a nitrogen atom and monochromatic ion energy.

2. The method of fabricating a semiconductor device according to claim 1, wherein said plasma etching step includes a step of plasma-etching said first insulator film with said etching gas including either ammonia gas or mixed gas of nitrogen gas and hydrogen gas and said monochromatic ion energy of at least 200 eV and not more than 600 eV.

3. The method of fabricating a semiconductor device according to claim 2, wherein said plasma etching step includes a step of plasma-etching said first insulator film with said etching gas including either ammonia gas or mixed gas of nitrogen gas and hydrogen gas and said monochromatic ion energy of at least 400 eV and not more than 600 eV.

4. The method of fabricating a semiconductor device according to claim 1, wherein said plasma etching step includes a step of plasma-etching said first insulator film with said etching gas including nitrogen gas and said monochromatic ion energy of at least 200 eV and not more than 400 eV.

5. The method of fabricating a semiconductor device according to claim 1, wherein said first etching mask layer includes at least one film selected from a group of an $Si_3N_4$ film, an $SiO_2$ film and an SiOCH film.

6. The method of fabricating a semiconductor device according to claim 1, wherein said first etching mask layer includes an $Si_3N_4$ film, and said plasma etching step includes a step of plasma-etching said first insulator film with said etching gas including ammonia gas and said monochromatic ion energy through a mask of said first etching mask layer including said $Si_3N_4$ film.

7. The method of fabricating a semiconductor device according to claim 1, wherein said first insulator film is a low dielectric constant insulator film having a dielectric constant of less than 3.9.

8. The method of fabricating a semiconductor device according to claim 1, wherein said plasma etching step includes a step of plasma-etching said first insulator film with said monochromatic ion energy defined as e(Vp+Vbias) when employing a plasma etching apparatus applying a DC bias voltage Vbias to a plasma source, assuming that Vp represents a plasma potential.

9. The method of fabricating a semiconductor device according to claim 1, wherein said plasma etching step includes a step of plasma-etching said first insulator film with said monochromatic ion energy prepared from high energy peak ion energy defined as e(Vp+2Vrf) when employing a plasma etching apparatus applying a high-frequency bias voltage Vrf·sin(2πft) to a substrate, assuming that Vp represents a plasma potential.

10. The method of fabricating a semiconductor device according to claim 1, wherein said plasma etching step includes a step of plasma-etching said first insulator film with said monochromatic ion energy e(Vp+|Vdc|) when employing a plasma etching apparatus applying a high-frequency bias voltage Vrf·sin(2π$f_1$t) having a high frequency $f_1$ of at least 10 MHz to a substrate, assuming that Vp represents a plasma potential and Vdc represents a voltage depending on electric charges stored in said substrate.

11. The method of fabricating a semiconductor device according to claim 1, wherein said plasma etching step includes a step of plasma-etching said first insulator film with said monochromatic ion energy e(Vp+|VPL|) when employing a plasma etching apparatus applying a pulse bias voltage VPL to a substrate, assuming that Vp represents a plasma potential.

12. The method of fabricating a semiconductor device according to claim 1, further comprising steps of:

forming a second insulator film including a polymer film containing a carbon atom and a hydrogen atom on said first etching mask layer, and forming a second etching mask layer on a prescribed region of said second insulator film in advance of said plasma etching step, wherein said plasma etching step includes a step of plasma-etching said second insulator film and said first insulator film with said etching gas containing a nitrogen atom and said monochromatic ion energy through masks of said second etching mask layer and said first etching mask layer thereby simultaneously forming a via hole and a wiring trench.

13. The method of fabricating a semiconductor device according to claim 12, wherein said second insulator film is a low dielectric constant insulator film having a dielectric constant of less than 3.9.

14. A method of fabricating a semiconductor device, comprising steps of:

forming a first insulator film including a polymer film containing a carbon atom and a hydrogen atom;

forming a first etching mask layer containing an Si atom on a prescribed region of said first insulator film;

forming a second insulator film including a polymer film containing C and H on said first etching mask layer;

forming a second etching mask layer on a prescribed region of said second insulator film; and simultaneously forming a via hole and a wiring trench by plasma-etching said second insulator film and said first insulator film with etching gas containing nitrogen and monochromated ion energy through masks of said second etching mask layer and said first etching mask layer.

15. The method of fabricating a semiconductor device according to claim 14, wherein said step of simultaneously forming said via hole and said wiring trench includes a step of plasma-etching said second insulator film and said first insulator film with said etching gas including either ammonia gas or mixed gas of nitrogen gas and hydrogen gas and said monochromatic ion energy of at least 200 eV and not more than 600 eV.

16. The method of fabricating a semiconductor device according to claim 15, wherein said step of simultaneously forming said via hole and said wiring trench includes a step of plasma-etching said second insulator film and said first insulator film with said etching gas including either ammonia gas or mixed gas of nitrogen gas and hydrogen gas and said monochromatic ion energy of at least 400 eV and not more than 600 eV.

17. The method of fabricating a semiconductor device according to claim 14, wherein said step of simultaneously forming said via hole and said wiring trench includes a step of plasma-etching said second insulator film and said first insulator film with said etching gas including nitrogen gas and said monochromatic ion energy of at least 200 eV and not more than 400 eV.

18. The method of fabricating a semiconductor device according to claim 14, wherein said second etching mask layer is a film containing Si.

19. The method of fabricating a semiconductor device according to claim 14, wherein said first etching mask layer includes an $Si_3N_4$ film, and said step of simultaneously forming said via hole and said wiring trench includes a step of plasma-etching said second insulator film and said first insulator film with said etching gas including ammonia gas and said monochromatic ion energy through masks of said second etching mask layer and said first etching mask layer including said $Si_3N_4$ film.

20. The method of fabricating a semiconductor device according to claim 14, wherein said first insulator film and said second insulator film are low dielectric constant insulator films having dielectric constants of less than 3.9.

* * * * *